United States Patent [19]

Takada

[11] Patent Number: 5,210,716

[45] Date of Patent: May 11, 1993

[54] SEMICONDUCTOR NONVOLATILE MEMORY

[75] Inventor: Ryoji Takada, Tokyo, Japan

[73] Assignee: Seiko Instruments Inc., Japan

[21] Appl. No.: 557,403

[22] Filed: Jul. 23, 1990

[30] Foreign Application Priority Data

Jul. 24, 1989 [JP] Japan .................................. 1-193367

[51] Int. Cl.[5] ...................... G11C 7/00; G11C 16/00; G11C 16/02; G11C 29/00
[52] U.S. Cl. .................................. 365/200; 365/185; 371/10.1; 371/21.4
[58] Field of Search ................... 365/200, 104, 230.03, 365/228, 185; 371/21.4, 10.2, 10.1, 8.2; 395/575, 425

[56] References Cited

U.S. PATENT DOCUMENTS

| 4,758,988 | 7/1988 | Kuo | 365/200 X |
|---|---|---|---|
| 4,766,573 | 8/1988 | Takemae | 365/200 X |
| 4,789,967 | 12/1988 | Liou et al. | 365/230.03 X |
| 4,803,656 | 2/1989 | Takemae | 365/200 |
| 4,811,303 | 3/1989 | Hirai | 365/104 X |
| 4,890,262 | 12/1989 | Hashimoto et al. | 365/200 |
| 4,899,342 | 2/1990 | Potter et al. | 371/10.1 |
| 4,942,575 | 7/1990 | Earnshaw et al. | 371/10.1 |
| 5,033,024 | 7/1991 | O'Connell et al. | 365/200 X |

Primary Examiner—Alyssa H. Bowler
Attorney, Agent, or Firm—Bruce L. Adams; Van C. Wilks

[57] ABSTRACT

The memory device is comprised of a plurality of memory arrays. Firstly, one of the memory arrays is selected for operation. When the selected one reaches an operational limit due to repetition of data rewriting which causes degradation of writing performance, another memory array is then selected for subsequent operation to thereby improve performance of the semiconductor nonvolatile memory device.

5 Claims, 4 Drawing Sheets 5,210,716

SEMICONDUCTOR NONVOLATILE MEMORY

BACKGROUND OF THE INVENTION

The present invention relates to a semiconductor nonvolatile memory for use in electronic instruments such as a computer.

The semiconductor nonvolatile memory of, particularly, the MOS type operates to carry out memory storing by utilizing channeling hot electrons or tunneling current so as to change a potential level of a floating gate electrode. FIG. 3 shows a rewriting performance of the general semiconductor nonvolatile memory. The floating gate electrode of the memory device changes its potential level according to different bits of data "1" and "0" between $+V_{TFG}$. This potential level difference is called normally the writing window of the nonvolatile memory. The width of the window tends to gradually reduce with repetition of rewriting operation due to carrier trapping which is induced while electrons pass through a thin gate insulating film, thereby limiting the allowable maximum cycle number of rewriting operations. Though, normally the nonvolatile memory of the MOS type has the maximum rewriting cycle number in the order of $10^5$–$10^6$, there is need for a further increase in the maximum rewriting cycle number in the memory market.

FIG. 2 is a structural block diagram showing the conventional semiconductor nonvolatile memory. A nonvolatile memory array 111 is connected to a row decoder 102, a column decoder 103 and an I/O circuit 104 containing a sensing amplifyer. Further, the I/O circuit 104 is connected to a programing pulse generating circuit 122. Further, there are provided address input terminals $A_0$-$A_n$, data input/output terminals $I/O_1$-$I/O_m$, a data reading terminal R and a programing control terminal STO.

Conventionally, the use of a nonvolatile memory array is terminated or stopped when the statistically determined maximum rewriting cycle number is reached without regard to the actual internal state of the array. Otherwise, the degradation degree of a memory array may be monitored by means of a monitor element which has the same rewriting performance as that of the memory array.

Conventionally, when significantly increasing the maximum rewriting cycle number, construction and fabrication process of the nonvolatile memory array must be upgraded.

SUMMARY OF THE INVENTION

An object of the invention is to effectively increase the maximum rewriting cycle number. According to the invention, there are provided a plurality of nonvolatile memory array components and a control circuit operative to drive selected memory array components to carry out thereby a continuous writing and reading operation. A nonvolatile counting circuit is utilized to enable the control circuit to switch sequentially the memory array components to thereby ensure continuous operation of the nonvolatile memory device. Otherwise, a writing level monitor is utilized to detect when the writing performance limit approaches so as to effect sequential switching of the array components. By such construction, the effective maximum rewriting cycle number of the device can be multiplied as a whole by the number of memory array components contained in the device without any upgrade in the structure and fabrication process of an individual memory array component.

DETAILED DESCRIPTION OF PREFERRED EMBODIMENTS

Figure 1:
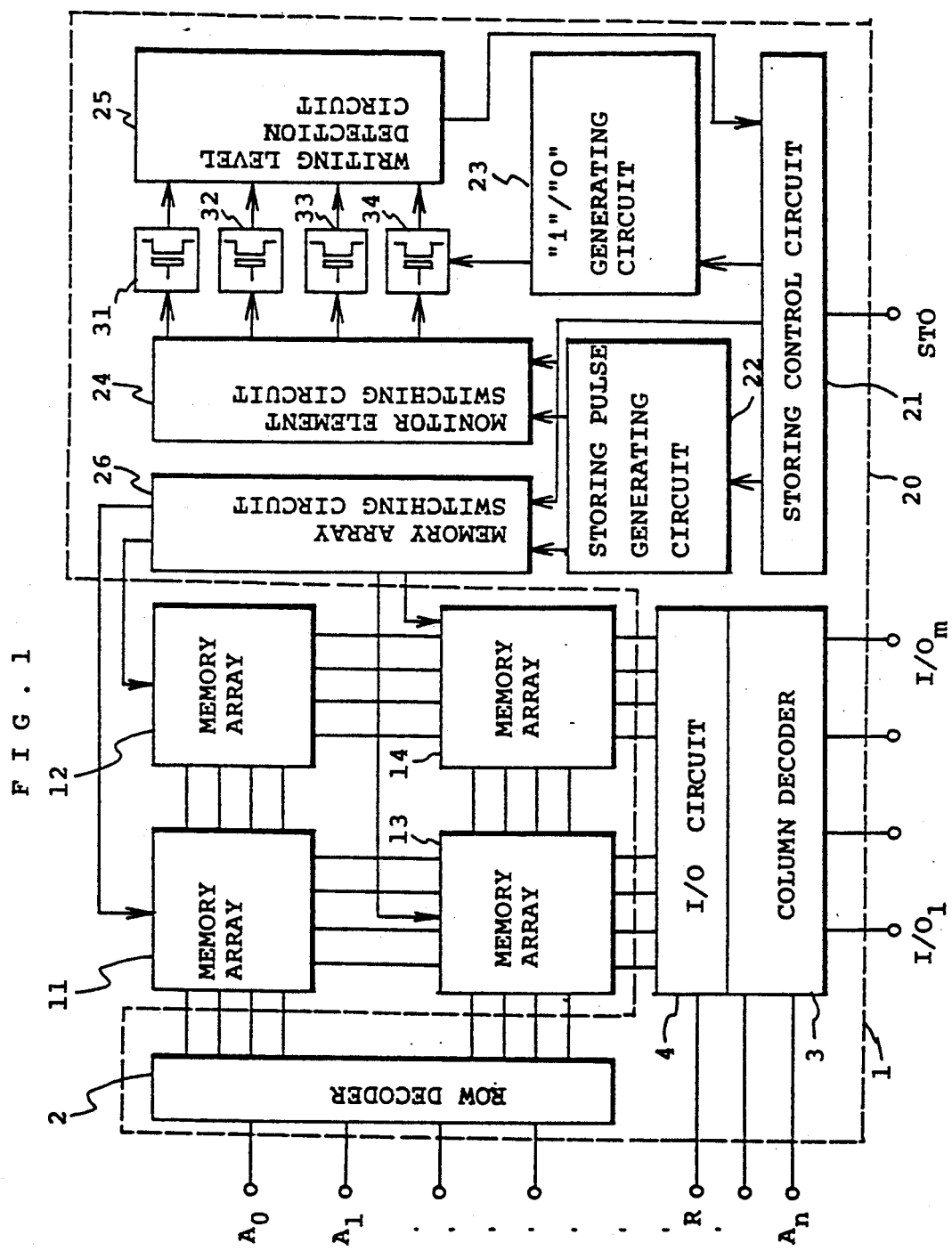
FIG. 1 is a block diagram showing one embodiment of the nonvolatile memory device according to the present invention.
Figure 2:
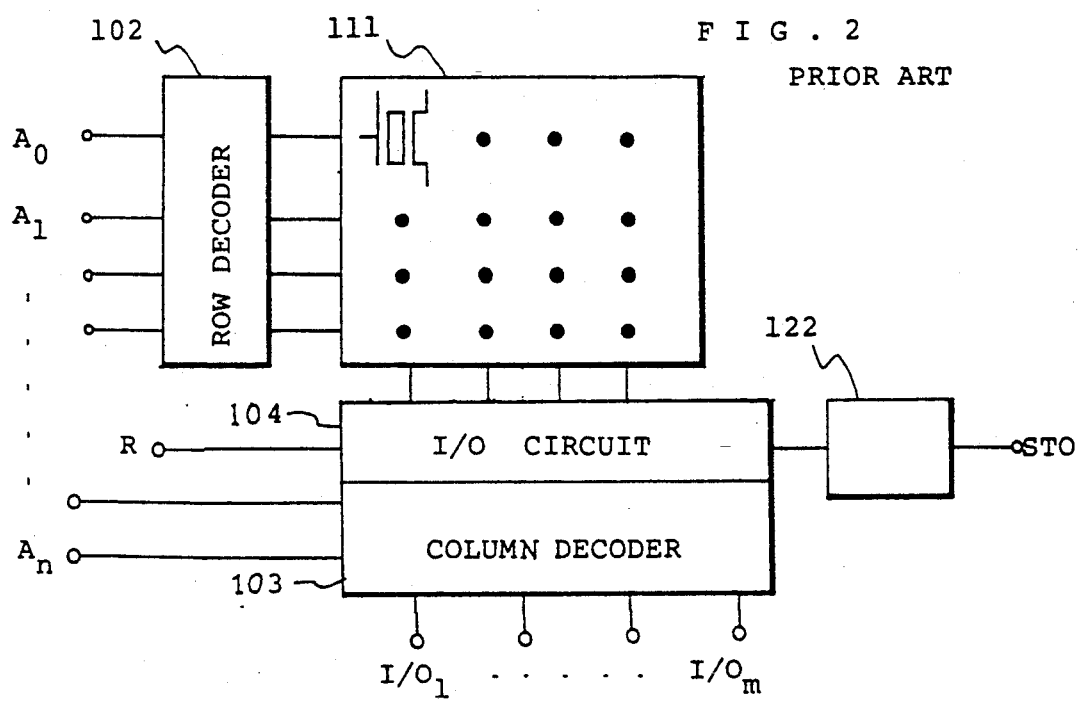
FIG. 2 is a block diagram showing the conventional nonvolatile memory device.
Figure 3:
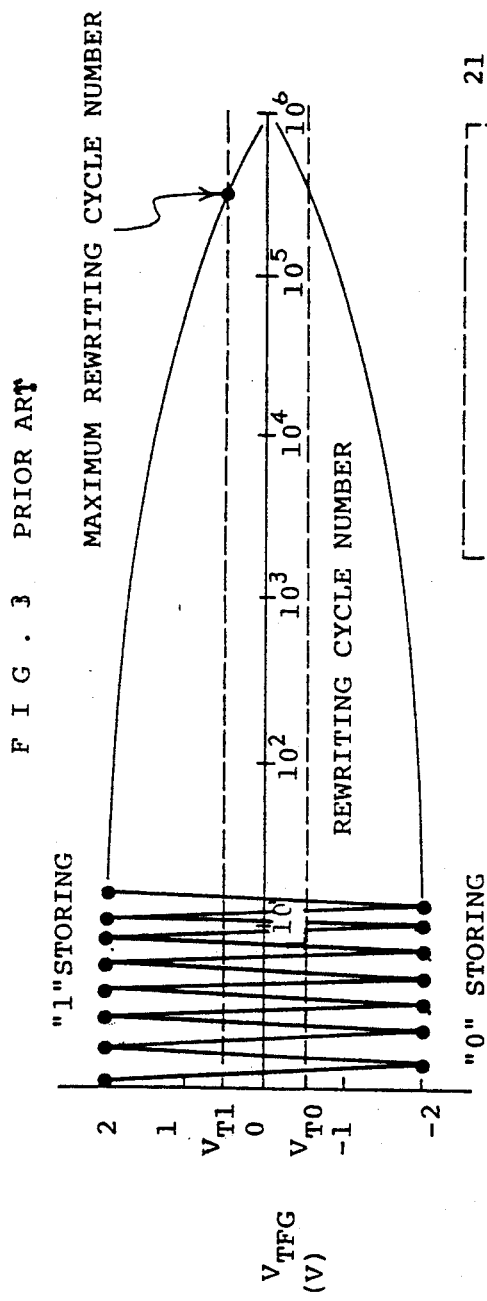
FIG. 3 is a graph showing rewriting performance of a nonvolatile memory array.

FIG. 1 is a structural block diagram showing one embodiment of the inventive semiconductor nonvolatile memory device. The memory device has address input terminals $A_0$-$A_n$, data input/output terminals $I/O_1$-$I/O_m$, a data reading terminal R and a data storing or programming terminal STO. The present embodiment is provided with a plurality of nonvolatile memory arrays 11-14 having the same size and same performance of the MOS type. These memory arrays 11-14 are connected to a row decoder 2, a column decoder 3 and an I/O circuit 4 including a sensing amplifyer, those of which constitute a peripheral circuit 1. Writing or programing of the nonvolatile memory is carried out such that a storing pulse generating circuit 22 generates according to a signal from the STO terminal a store pulse or program pulse which is fed to one of the memory arrays 11-14 through a memory array switching circuit 26.

Hereinafter, detailed description in given for the operation. Firstly when a power source is turned on, the storing control circuit 21 is initially set to operate the first memory array 11 and a corresponding monitor element 31. In this regard, respective monitor elements 31-34 have the same construction as that of corresponding one of the memory arrays 11-14. Memory array switching circuit 26 and monitor element switching circuit 24 comprise electromagnetic switches or transistors and are adapted to switch memory arrays or monitor elements according to signals from the storing control circuit 21.

When the store signal STO or program signal is inputted, there is generated the store pulse or program pulse of 10–20 V effective to start a selective rewriting operation or programming of the first memory array 11 through the memory array switching circuit 26. In similar manner, the monitor element 31 is operated in response to the store pulse through a monitor element switching circuit 24 so that the monitor element 31 receives alternate "1"/"0" data signal from a "1"/"0" data generating circuit 23. Rewriting with the "1" or the "0" data signal alternately has a much greater effect on the rewriting performance as compared to rewriting from the "1" to the "1" data signal or from the "0" to the "0" data signal. Therefore, under this extreme condition, the monitor element is operated to monitor degradation degree so as to effectively avoid inadvertent failure or breakdown of a memory array during the course of use.

Figure 4:
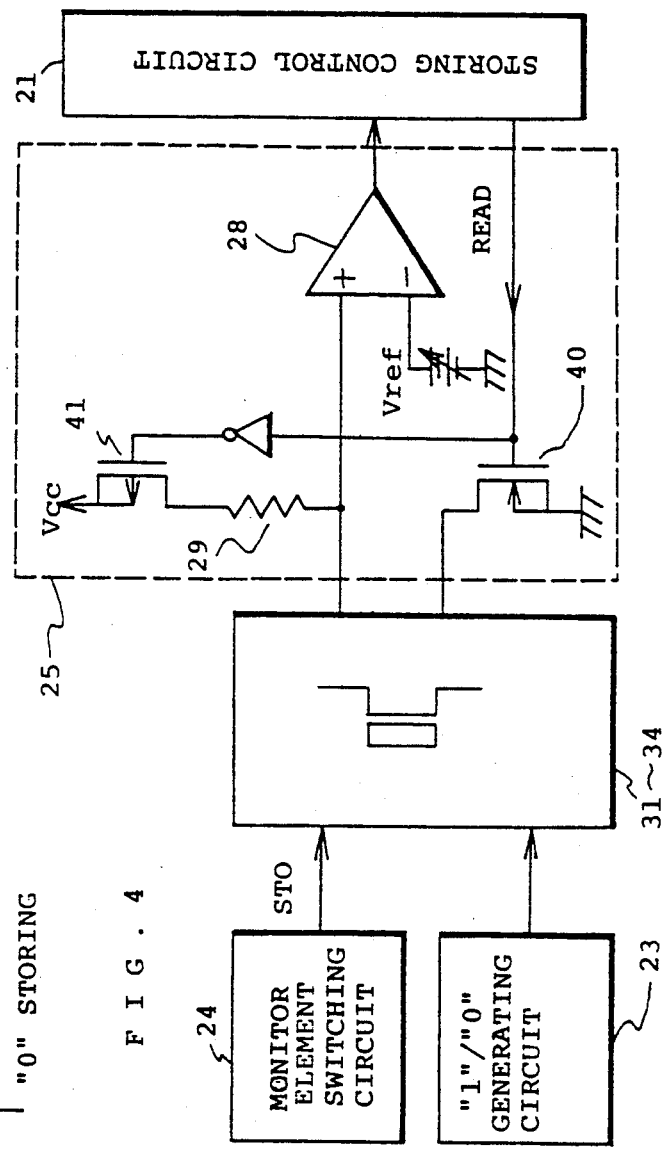
FIG. 4 is an embodiment of a writing level detection circuit.

Writing level $V_{TFG}$ or window width of the monitor element 31 is periodically checked by a writing level detection circuit 25 so as to enable continuous rewriting of the corresponding memory array until the writing performance limit is reached. FIG. 4 is an embodiment of a writing level detection circuit. One of the monitor elements is programmed in the state of "1" or "0" by a "1"/"0" pulse from the "1"/"0" generating circuit 23 through the monitor element circuit 24.

The monitor element is in the state of "OFF" when it is programmed in the state of "1", and it is in the state of "ON" when it is programmed in the state of "0". Power supply voltage Vcc is applied to the monitor element through the resistor 29 when an n-ch MOS transistor 30 and a p-ch MOS transistor 31 are switched on by a READ signal from the storing control circuit 21. In that case, if the monitor element is in the state of "OFF", about Vcc level voltage is inputted into the comparator 28 since the drain current does not flow through the monitor element, and if the monitor element is in the state of "ON", the ground level voltage is inputted into the comparator 28 since the drain current does flow through the same. Due to this voltage difference inputted into the comparator 28, the comparator 28 detects the writing level of the monitor element, and outputs a signal to the storing control circuit 21. When the writing level detection circuit 25 detects that the limit is reached, the storing or programing control circuit 21 immediately operates to switch to the second memory array 12 and to the corresponding monitor element 32. This switching is effected when the power source is turned on. By such operation, when one memory array component reaches the writing performance limit, another memory array component is selected subsequently.

Figure 5:
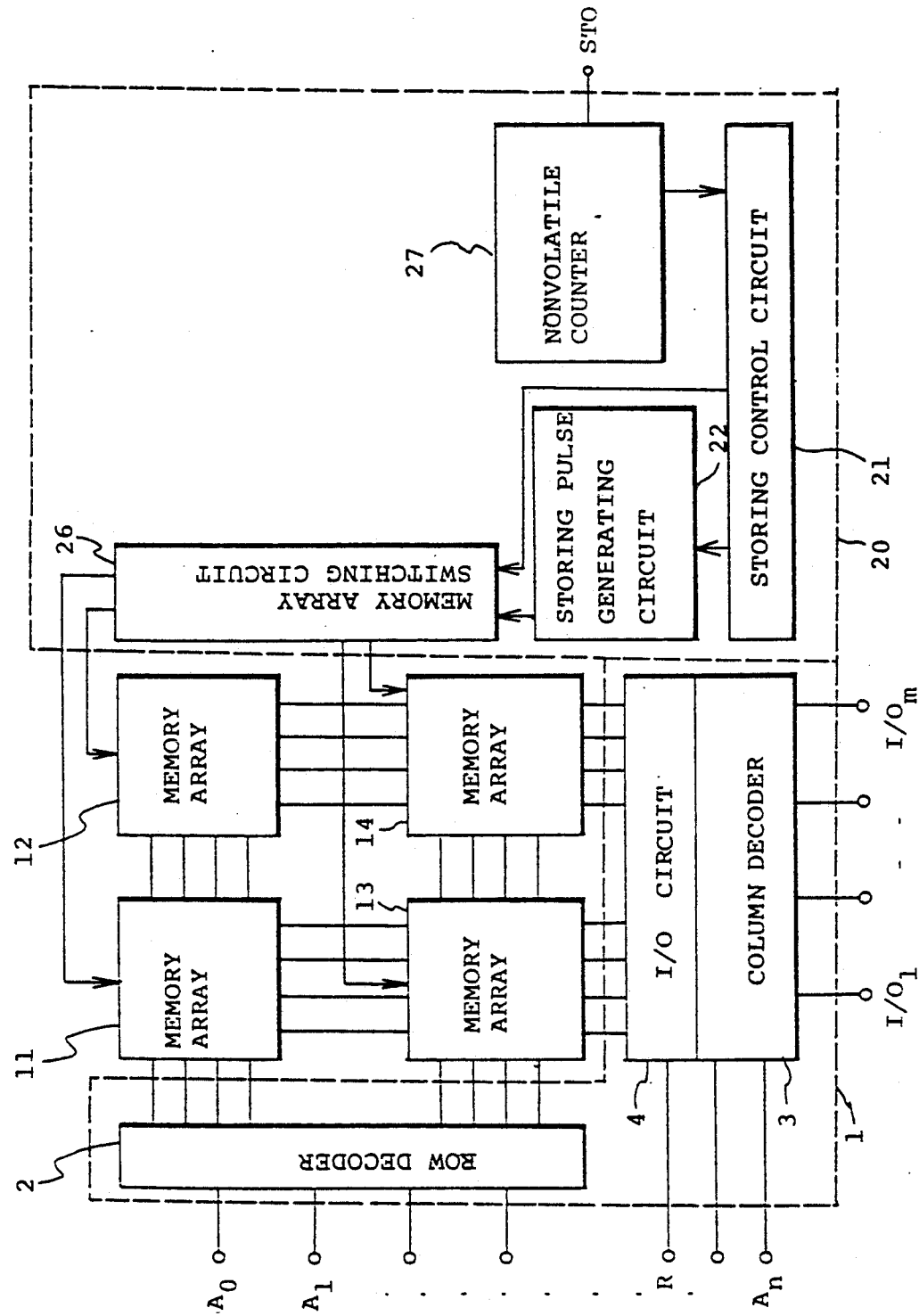
FIG. 5 is a block diagram showing another embodiment of the nonvolatile memory device according to the invention.

FIG. 5 shows another embodiment of the present invention. Whereas the switching timing is determined in terms of change in the writing level or window width of the monitor element in the FIG. 1 embodiment, the FIG. 5 embodiment effects switching of memory arrays 11-14 according to an expected or predetermined rewriting cycle number. In such case, a nonvolatile counter 27 is operated nonvolatilely to accumulatively count an occurrence number of store or program pulses to determine when the predetermined rewriting cycle number is reached.

As described above, the present invention can achieve prolonged rewriting performance several times as long as the prior art without any modification of device process. As understood from the FIG. 1 block diagram, the present invention utilizes a plurality of memory array components, thereby increasing an overall area dimension of a chip. However, the inventive construction is most suitable for a nonvolatile memory of the type needing a great cycle number of rewriting with a relatively small capacity.

What is claimed is:

1. A semiconductor nonvolatile memory device comprising:
    a plurality of memory arrays for effecting nonvolatile data storage in terms of two different stable states corresponding to a binary signal in the form of "1" and "0";
    a peripheral circuit for driving selectively each memory array to effect addressing and reading; and
    a control circuit operative when a selected memory array reaches an operational limit of rewriting cycle number to switch to another memory array to thereby ensure continuous operation of the device, the control circuit comprising:
    (a) a storing control circuit for receiving a data writing signal from a data store terminal to generate signals,
    (b) a storing pulse generating circuit responsive to one of the signals from the storing control circuit for generating a storing pulse,
    (c) a memory array switching circuit responsive to the storing pulse for relaying the storing pulse and responsive to one of the signals from the storing control circuit for switching memory arrays,
    (d) a "1"/"0" generating circuit responsive to one of the signals from the storing control circuit for generating a "1" or "0" data signal alternatively,
    (e) monitor elements responsive to the "1" or "0" signal from the "1"/"0" generating circuit for generating a writing level,
    (f) a writing level detection circuit for detecting the writing level of one of the monitor elements and outputting a signal to the storing control circuit according to the writing level of said one of the monitor elements, and
    (g) a monitor element switching circuit for relaying the storing pulse to one of the monitor elements and responsive to one of the signals from the storing control circuit for switching monitor elements.

2. A semiconductor nonvolatile memory device, comprising: a plurality of memory arrays; a peripheral circuit for selectively driving each memory array to effect addressing and reading; and control circuit means for determining when an operational limit of rewriting cycles of a selected memory array has been reached and then switching from the selected memory array to another memory array to be driven by the peripheral circuit.

3. A memory device according to claim 2, wherein the control circuit means includes a plurality of monitoring elements corresponding to and having the same construction as a respective memory array, a data generating circuit for writing a data signal to one of the monitoring elements with each rewriting cycle of the corresponding memory arrays, and a writing level detection circuit responsive to the monitoring elements for detecting when the operational limit of rewriting cycles has been reached.

4. A memory device according to claim 3, wherein the data generating circuit has means for writing the data signal with each rewriting cycle so as to have a different value from the data signal written during the just previous rewriting cycle.

5. A memory device according to claim 2, wherein the control circuit means includes a nonvolatile counter for accumulatively counting a predetermined number of rewriting cycles of the selected memory array to determine when the operational limit of rewriting cycles has been reached.

* * * * *